(12) United States Patent
Ko et al.

(10) Patent No.: US 7,906,773 B2
(45) Date of Patent: Mar. 15, 2011

(54) PHASE CHANGE MEMORY DEVICE

(75) Inventors: Seung-Pil Ko, Suwon-si (KR); Jae-Hee Oh, Seongnam-si (KR); Jung-Hoon Park, Seoul (KR); Yoon-Jong Song, Seoul (KR); Jae-Hyun Park, Yongin-si (KR); Dong-Won Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 94 days.

(21) Appl. No.: 12/382,781

(22) Filed: Mar. 24, 2009

(65) Prior Publication Data
US 2009/0242866 A1    Oct. 1, 2009

(30) Foreign Application Priority Data

Mar. 28, 2008  (KR) ................ 10-2008-0029247

(51) Int. Cl.
*H01L 21/00*    (2006.01)
(52) U.S. Cl. .......................................... 257/2; 438/100
(58) Field of Classification Search ....... 257/2, E21.001, 257/E47.001; 438/95, 104, 652
See application file for complete search history.

(56) References Cited

U.S. PATENT DOCUMENTS

| | | | |
|---|---|---|---|
| 6,621,095 B2 * | 9/2003 | Chiang et al. | 257/5 |
| 7,229,887 B2 | 6/2007 | Dennison | |
| 7,307,269 B2 * | 12/2007 | Kim et al. | 257/2 |
| 7,541,252 B2 | 6/2009 | Eun et al. | |
| 7,674,709 B2 * | 3/2010 | Happ | 438/637 |
| 2007/0108430 A1 * | 5/2007 | Lung | 257/4 |
| 2007/0246440 A1 | 10/2007 | Sato | |

FOREIGN PATENT DOCUMENTS

| | | |
|---|---|---|
| JP | 2007-288083 A | 11/2007 |
| KR | 10-2006-0002134 A | 1/2006 |
| KR | 10-0782496 B1 | 11/2007 |

* cited by examiner

*Primary Examiner* — Phuc T Dang
(74) *Attorney, Agent, or Firm* — Lee & Morse, P.C.

(57) ABSTRACT

A semiconductor device includes an insulating layer on a substrate, a first electrode in the insulating layer having a first upper surface and a second upper surface, a second electrode in the insulating layer spaced apart from the first electrode by a first distance and having a third upper surface and a fourth upper surface, the third upper surface being disposed at a substantially same level as the first upper surface, and the fourth upper surface being disposed at a substantially same level as the second upper surface, a first phase change material pattern covering a part of the first upper surface of the first electrode, and a second phase change material pattern covering a part of the third upper surface of the second electrode, wherein an interface region between the second phase change pattern and the second electrode is spaced apart from an interface region between the first phase change pattern and the first electrode by a second distance greater than the first distance.

17 Claims, 9 Drawing Sheets

PHASE CHANGE MEMORY DEVICE

BACKGROUND

1. Field

Example embodiments relate to a phase change memory device and a method of fabricating the same. More particularly, example embodiments relate to a phase change memory device structure capable of reducing a reset current and a method of fabricating the same.

2. Description of the Related Art

Extensive work on a new memory device having a structure that has non-volatile memory characteristics and efficiently improves integration density has been done. As a result, a phase change memory device may be developed. A unit cell of the phase change memory device may include an access device and a data storage element serially connected to the access device.

SUMMARY

Example embodiments are directed to a phase change memory device and a method of fabricating the same, which substantially overcome one or more of the disadvantages and shortcomings of the related art.

It is therefore a feature of an example embodiment to provide a phase change memory device structure capable of minimizing a reset current.

It is another feature of an exemplary embodiment to provide a method of manufacturing a phase change memory device structure capable of minimizing a reset current.

At least one of the above and other features and advantages may be realized by providing a semiconductor device, including a phase change material pattern configured to cover a part of a lower electrode. The device may include a first electrode provided in the insulating layer and having a first upper surface and a second upper surface. A second electrode spaced apart from the first electrode by a first distance may be provided in the insulating layer. In this case, the second electrode may have a third upper surface disposed at the same level as the first upper surface, and a fourth upper surface disposed at the same level as the second upper surface. A first phase change material pattern configured to cover a part of the first upper surface of the first electrode, and a second phase change material pattern configured to cover a part of the third upper surface of the second electrode may be provided. A portion of the first phase change material pattern configured to cover a part of the first upper surface of the first electrode and a portion of the second phase change material pattern configured to cover the third upper surface of the second electrode may be spaced apart from each other by a second distance greater than the first distance.

The first and third upper surfaces of the first and second electrodes may be disposed at a higher level than the second and fourth upper surfaces of the first and second electrodes.

The semiconductor device may further include an isolation pattern configured to cover the second and fourth upper surfaces of the first and second electrodes, and a molding pattern configured to cover the first and third upper surfaces of the first and second electrodes. In this case, the molding pattern may cover a portion other than the part of the first and third upper surfaces of the first and second electrodes covered by the first and second phase change material patterns.

The upper surface of the isolation pattern may be disposed at the same level as that of the insulating layer.

Sidewalls of the first and second phase change material patterns may be surrounded by the molding and isolation patterns.

An upper surface of the molding pattern may be disposed at the same level as that of the isolation pattern.

Sidewalls of the first and second phase change material patterns may be surrounded by the molding pattern.

The first and second upper surfaces may be disposed at the same level as the third and fourth upper surfaces. An isolation pattern may be configured to cover the first and third upper surfaces of the first and second electrodes. In this case, the molding pattern may cover a portion other than the part of the first and third upper surfaces of the first and second electrodes covered by the first and second phase change material patterns.

The first and second phase change material patterns may cross middle portions of the first and third upper surfaces of the first and second electrodes.

When viewed from a plan view, each of the first and third upper surfaces of the first and second electrodes may have a line shape or a curved shape.

Each of the first and second electrodes may include a bottom portion having the shape of a plate, and a body projecting from at least a part of the bottom portion.

Each of the first and second electrodes may include a bottom portion having the shape of a plate, and a body projecting from an edge portion of the bottom portion.

The semiconductor device may further include first and second cell diodes on the substrate, wherein the first cell diode may be disposed at a lower level than the first electrode and aligned with a bottom portion of the first electrode, and the second cell diode may be disposed at a lower level than the second electrode and aligned with a bottom portion of the second electrode.

The semiconductor device may further include a planarized buffer pattern formed on each of the first and second phase change material patterns, and a conductive pattern on the planarized buffer pattern. Each of the first and second phase change material patterns may have a recessed region on the upper surface thereof. Each of the first and second phase change material patterns may be self-aligned with the conductive pattern.

At least one of the above and other features and advantages may be also realized by providing a semiconductor device, including a lower electrode on a substrate, the lower electrode having first and second upper surfaces disposed at different heights as determined with respect to the substrate, and a phase change material pattern covering a part of the first upper surface of the lower electrode. The first upper surface may be disposed at a higher level than the second upper surface.

The semiconductor device may further include an insulating material covering the first and second upper surfaces of the electrode. In this case, the insulating material may cover a portion other than the part of the first and second upper surfaces covered by the phase change material pattern.

The semiconductor device may further include a planarized buffer pattern on the phase change material pattern, and a conductive pattern on the planarized buffer pattern, wherein the conductive pattern may be self-aligned with the phase change material pattern, and the phase change material pattern may have a recessed region on the upper surface thereof.

At least one of the above and other features and advantages may be also realized by providing a method of fabricating a semiconductor device, including forming an insulating layer having first and second holes spaced apart from each other by a first distance on a substrate. A first electrode structure including a first electrode having a first upper surface and a second upper surface in the first hole, and a second electrode structure including a second electrode having a third upper surface and a fourth upper surface in the second hole may be formed. Here, the first and third upper surfaces of the first and second electrodes are disposed at the same level, and the second and fourth upper surfaces of the first and second electrodes are disposed at the same level. A first phase change material pattern configured to cover a part of the first upper surface of the first electrode, and a second phase change material pattern configured to cover a part of the third upper surface of the second electrode are formed. Here, a portion of the first phase change material pattern configured to cover a part of the first upper surface of the first electrode and a portion of the second phase change material pattern configured to cover a part of the third upper surface of the second electrode are spaced apart from each other by a second distance greater than the first distance.

The method may further include, before forming the first and second phase change material patterns, forming an isolation pattern configured to cover the second and fourth upper surfaces of the first and second electrodes, and forming a molding pattern having openings crossing the middle portion of the first upper surface of the first electrode and the middle portion of the third upper surface of the second electrode.

The method may further include forming a mask pattern configured to cover the first and third upper surfaces of the first and second electrodes, etching the second and fourth upper surfaces of the first and second electrodes using the mask pattern as an etch mask, and removing the mask pattern.

Forming the first and second electrode structures may include forming an electrode material layer on the substrate having the insulating layer, forming an internal material layer configured to fill the first and second holes on the electrode material layer, and planarizing the internal material layer and the electrode material layer to expose the insulating layer and form internal patterns in the first and second holes, and electrodes surrounding sidewalls and bottom surfaces of the internal patterns.

The method may further include forming a planarized buffer pattern and a conductive pattern, which are sequentially stacked, on the first and second phase change material patterns. Here, forming the first and second phase change material patterns, the planarized buffer patterns, and the conductive patterns may include forming a phase change material layer, which has recessed regions on the upper surface thereof, on the substrate having the first and second electrode structures, wherein the recessed regions are disposed on the first and second electrode structures, forming a buffer layer on the substrate having the phase change material layer, planarizing the buffer layer, forming a conductive layer on the planarized buffer layer, and patterning the conductive layer, the planarized buffer layer, and the phase change material layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE INVENTION

Figure 1:
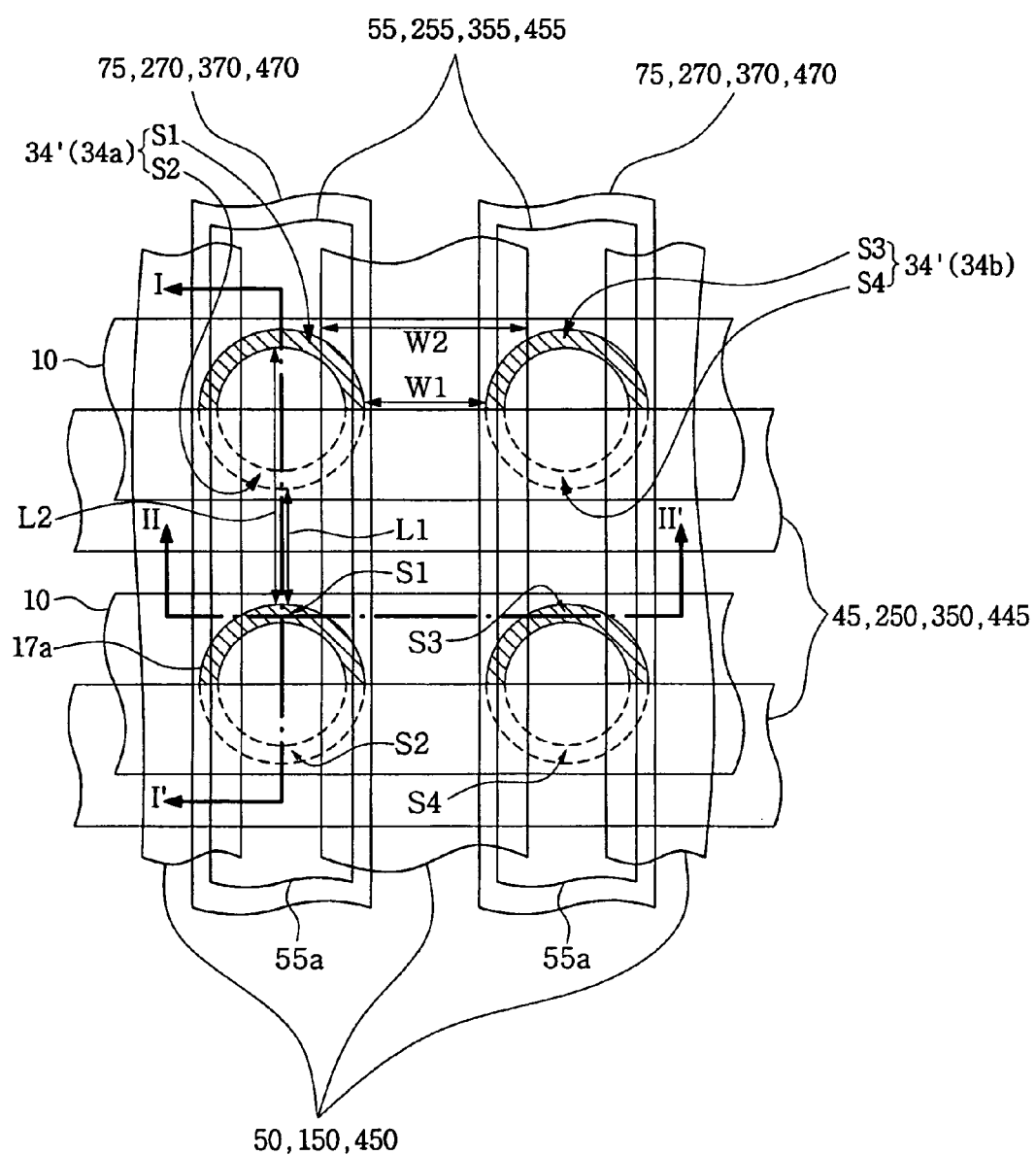
FIG. 1 illustrates a plan view of a semiconductor device according to example embodiments.

Korean Patent Application No. 10-2008-0029247, filed on Mar. 28, 2008, in the Korean Intellectual Property Office, and entitled: "Phase Change Memory Device and Methods of Fabricating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the terms "a" and "an" are open terms that may be used in conjunction with singular items or with plural items.

Figure 2A:
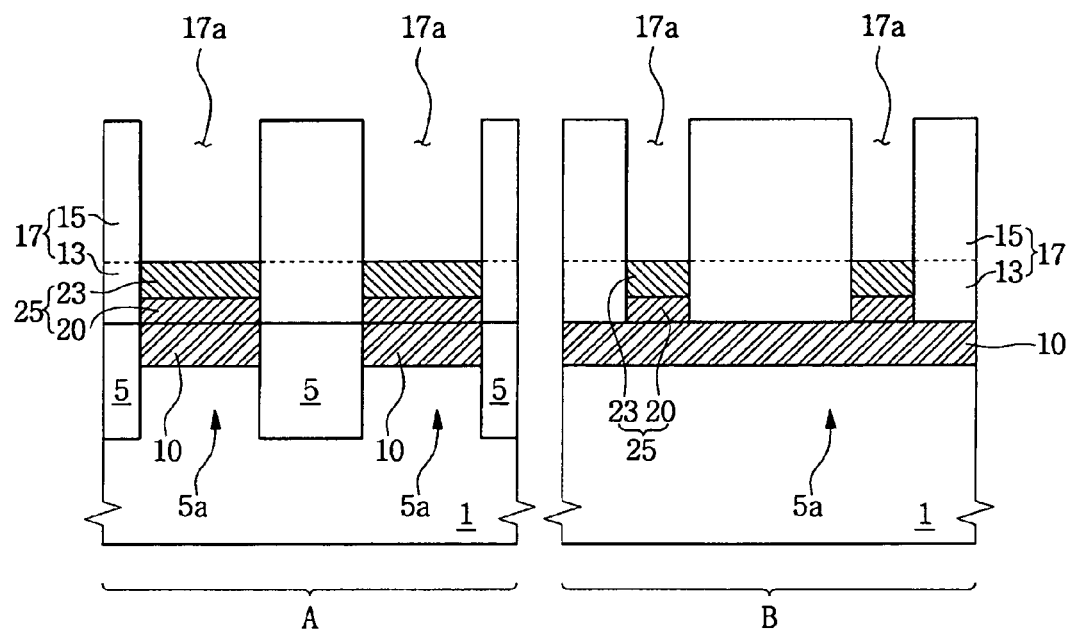
FIGS. 2A to 2F illustrate cross-sectional views of a method of fabricating a semiconductor device according to an example embodiment.
Figure 2B:
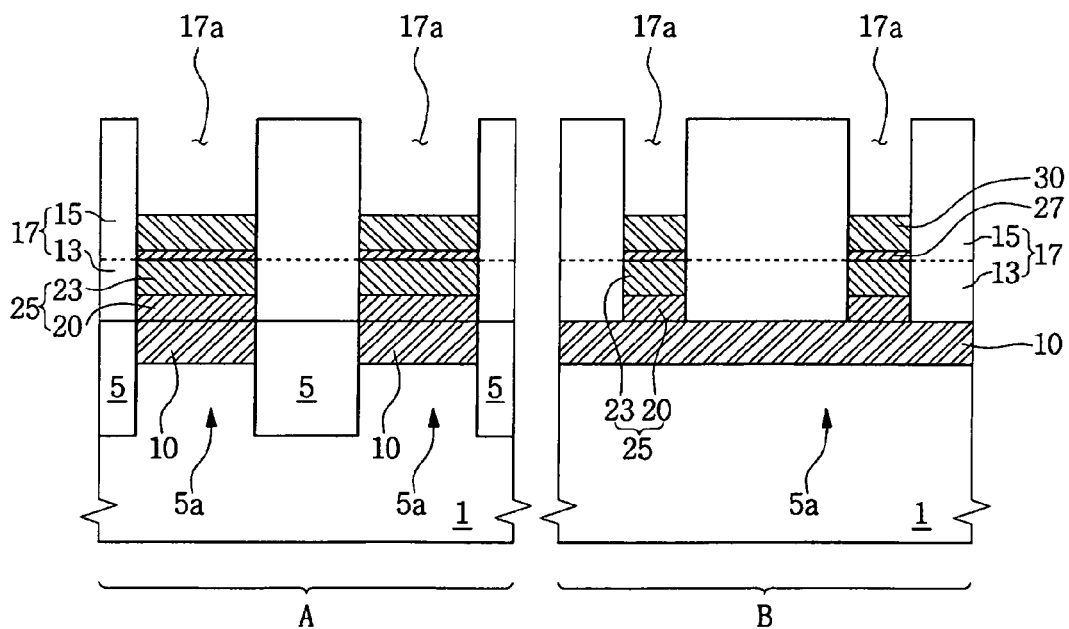
Figure 2C:
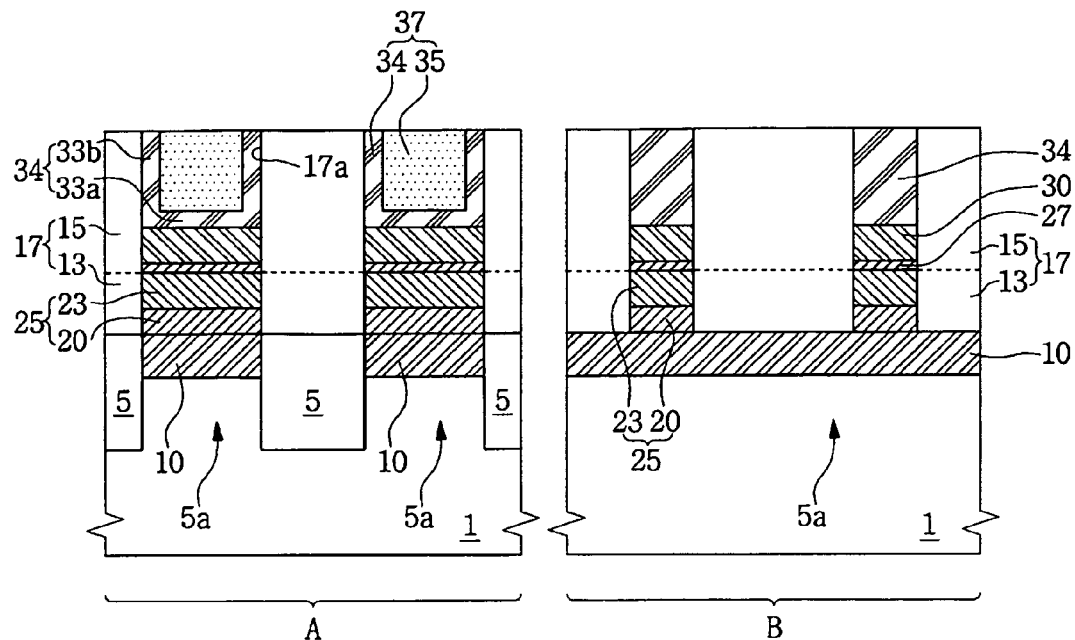
Figure 2D:
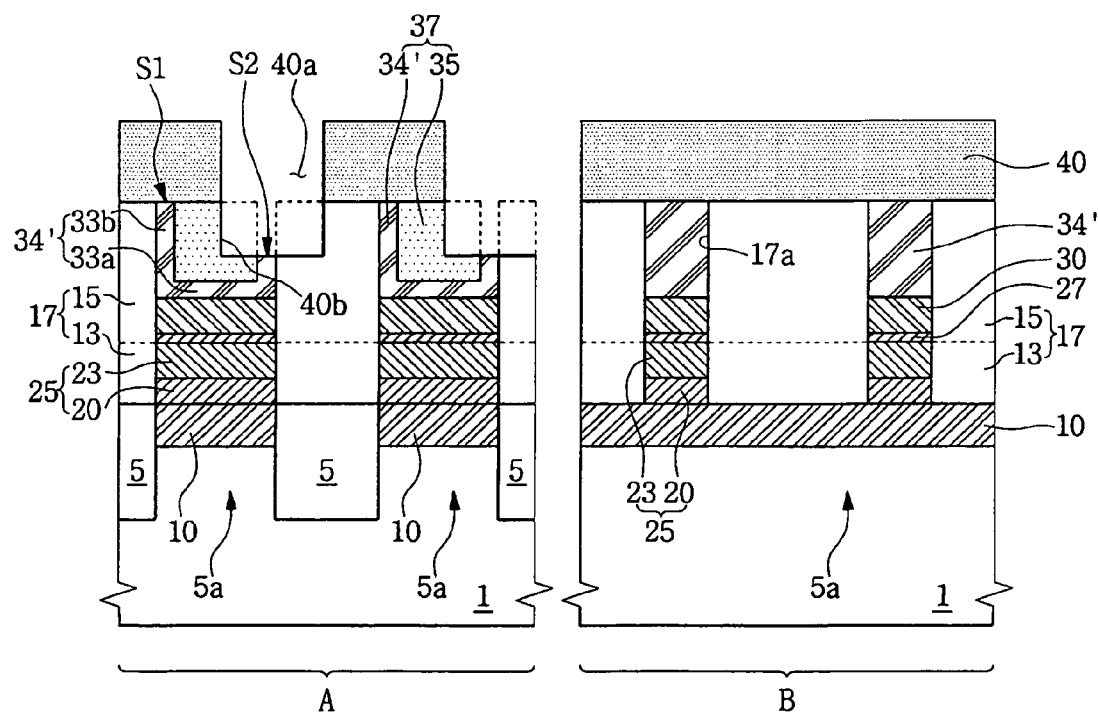
Figure 2E:
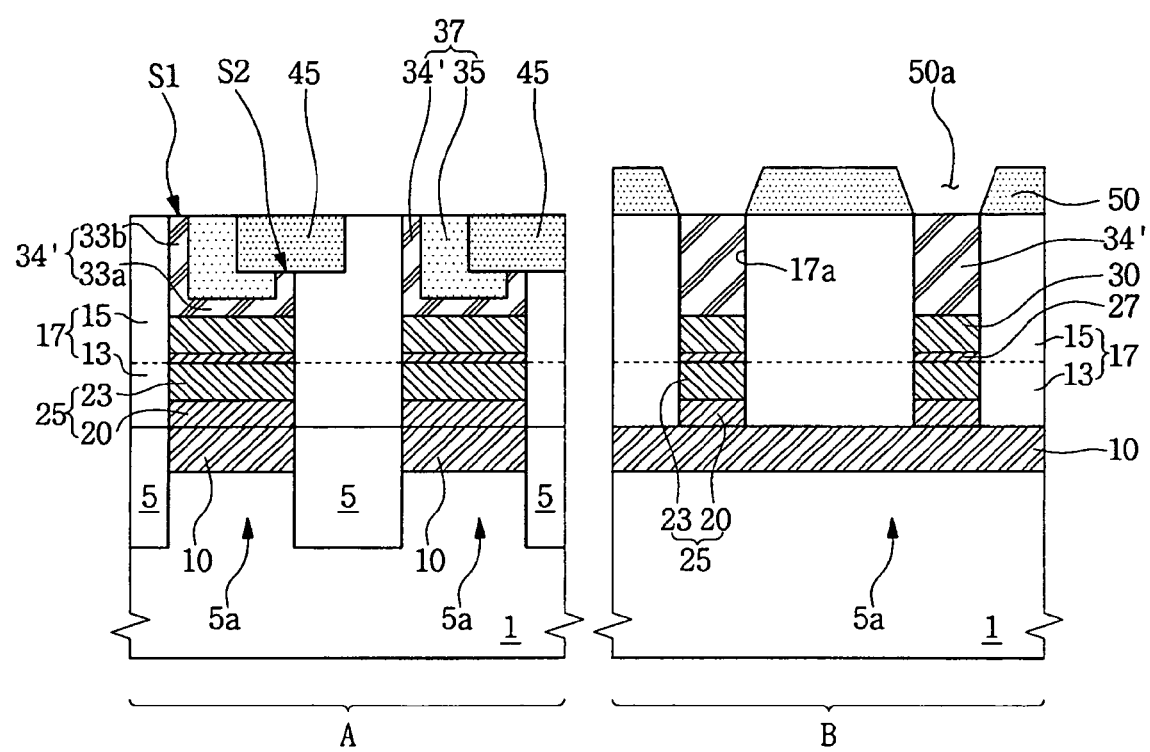
Figure 2F:
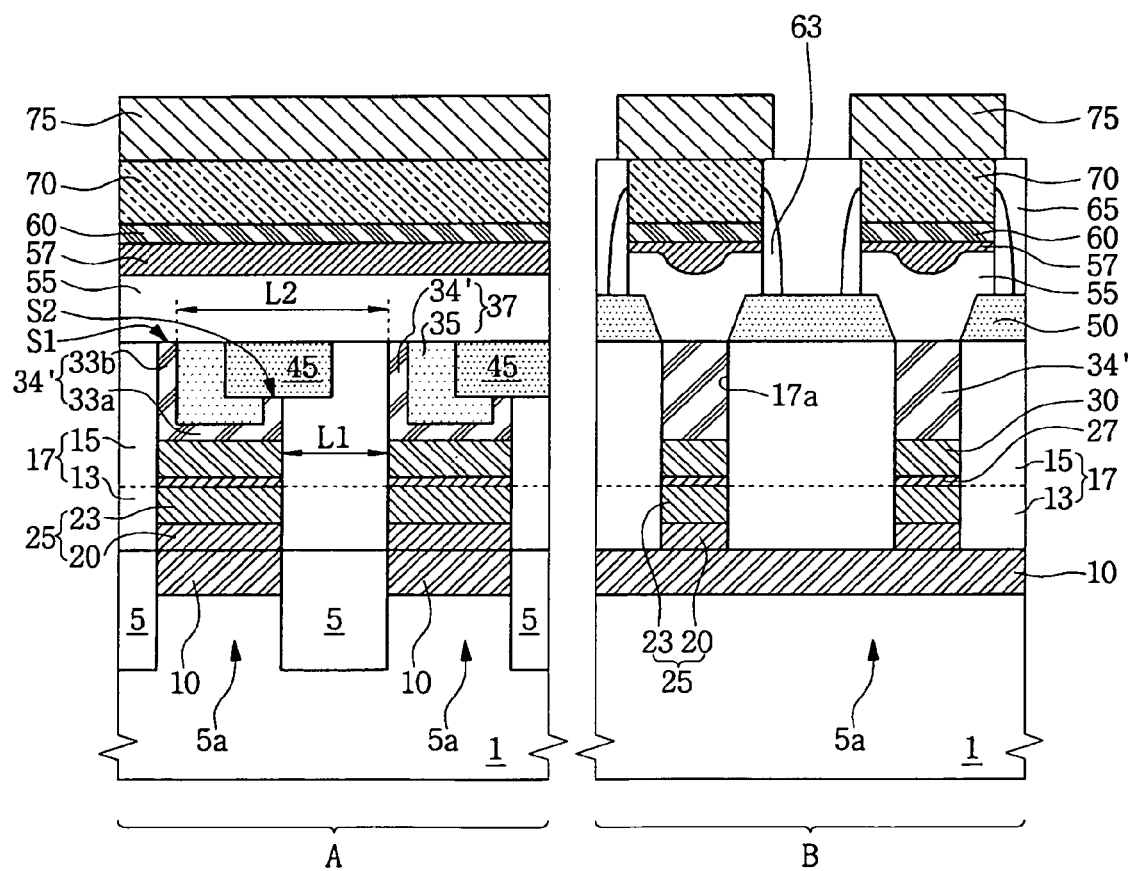
Figure 3A:
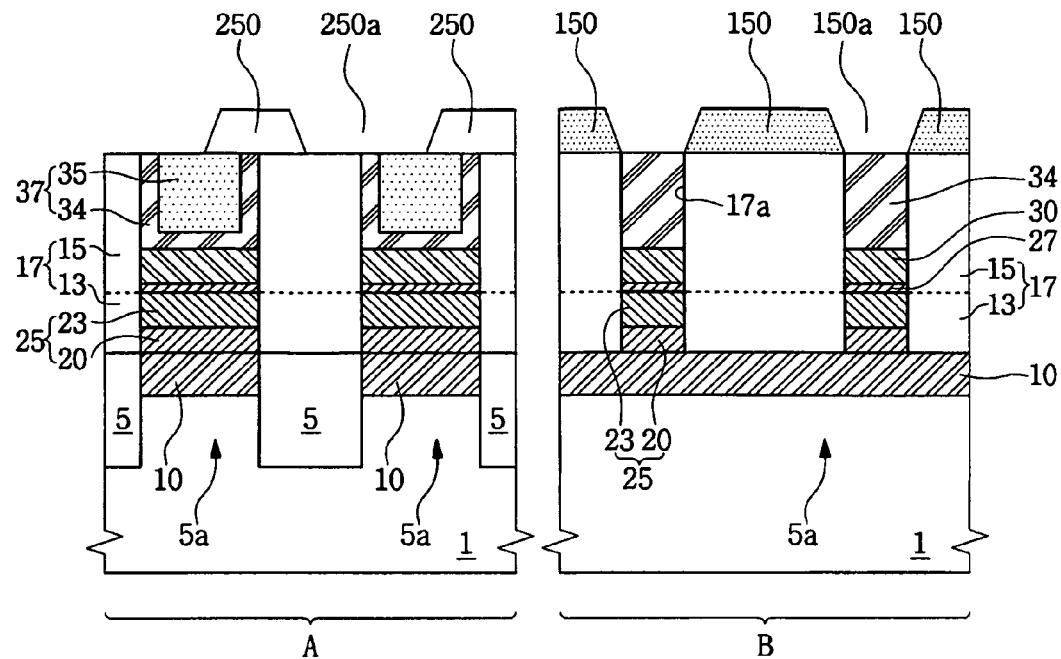
FIGS. 3A and 3B illustrate cross-sectional views of a method of fabricating a semiconductor device according to another example embodiment.
Figure 3B:
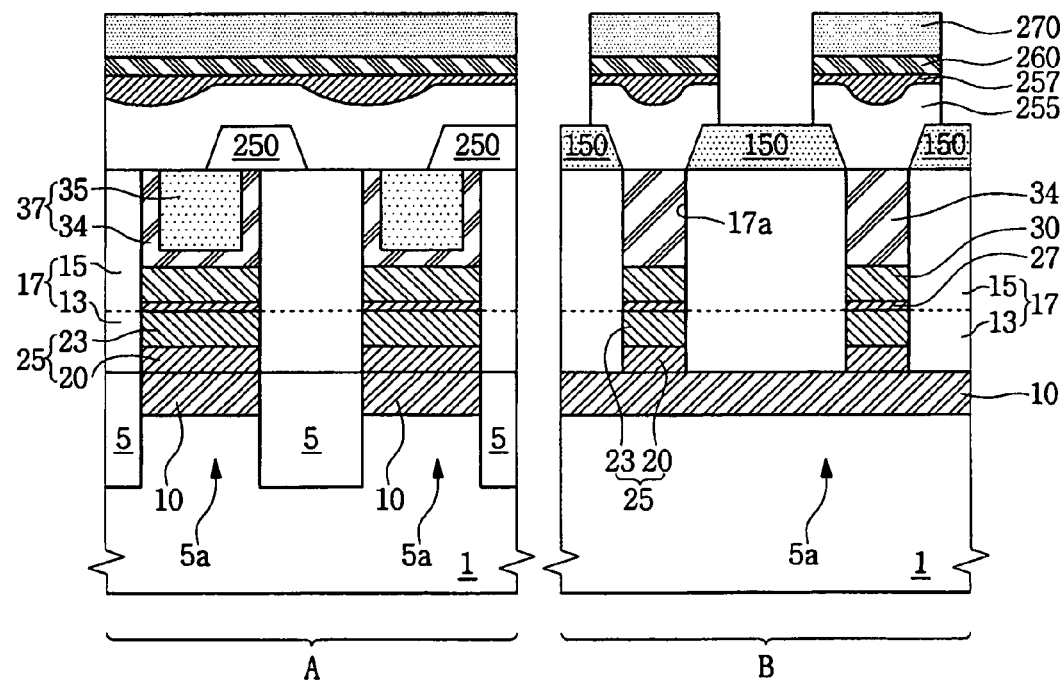
Figure 4A:
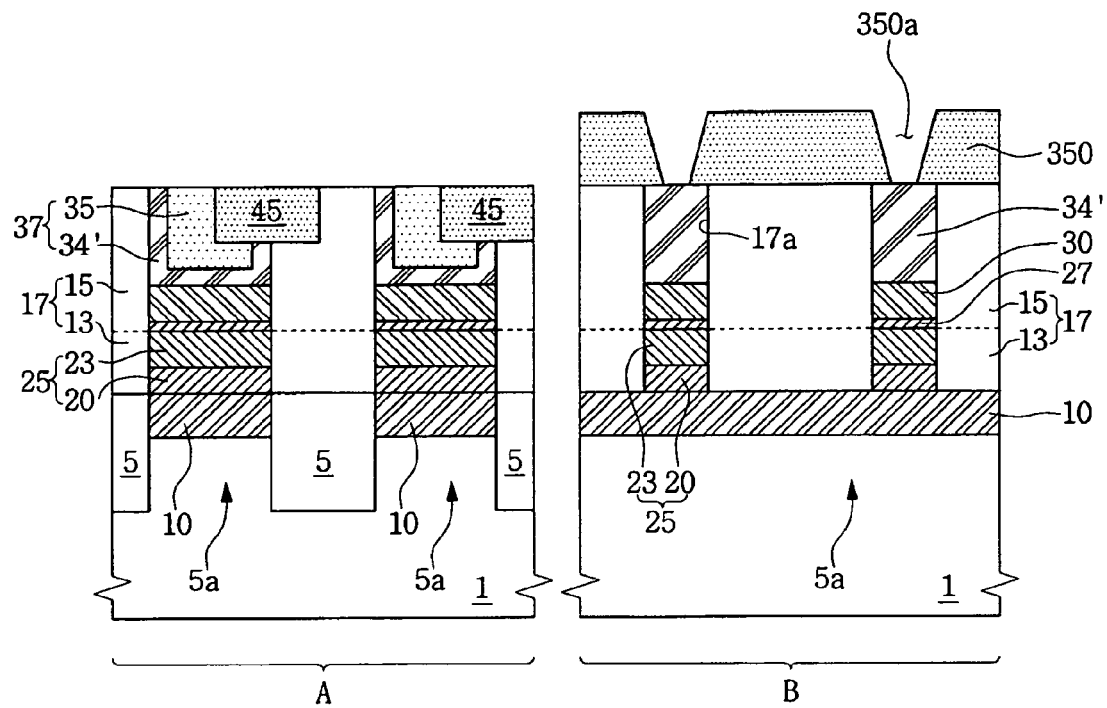
FIGS. 4A and 4B illustrate cross-sectional views of a method of fabricating a semiconductor device according to another example embodiment.
Figure 4B:
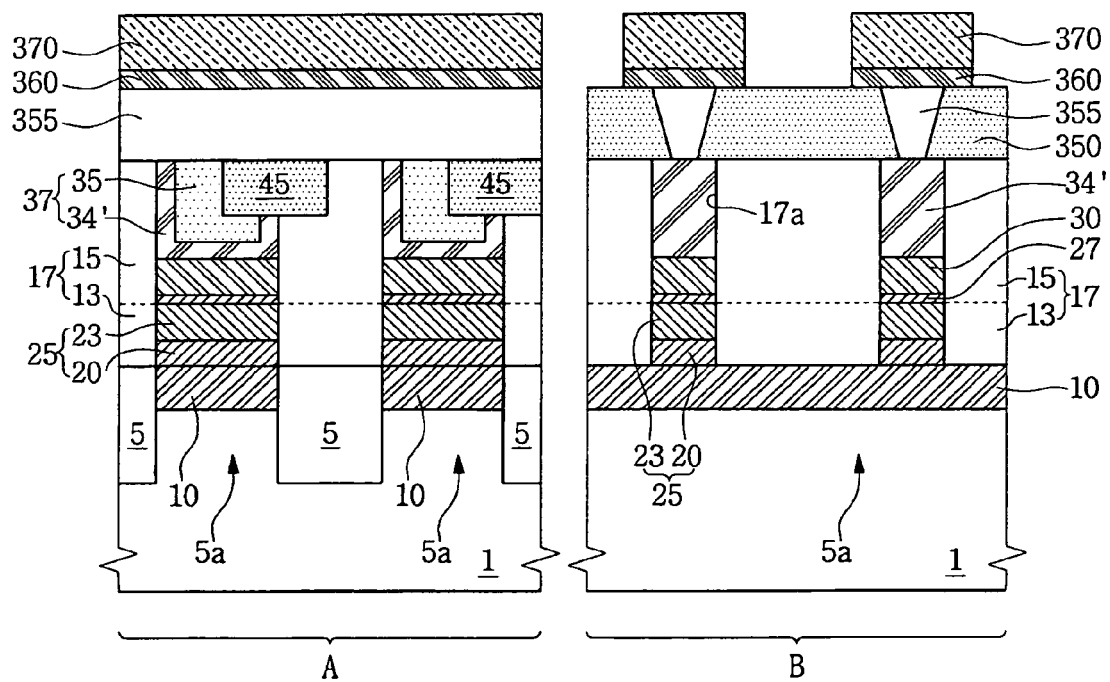
Figure 5A:
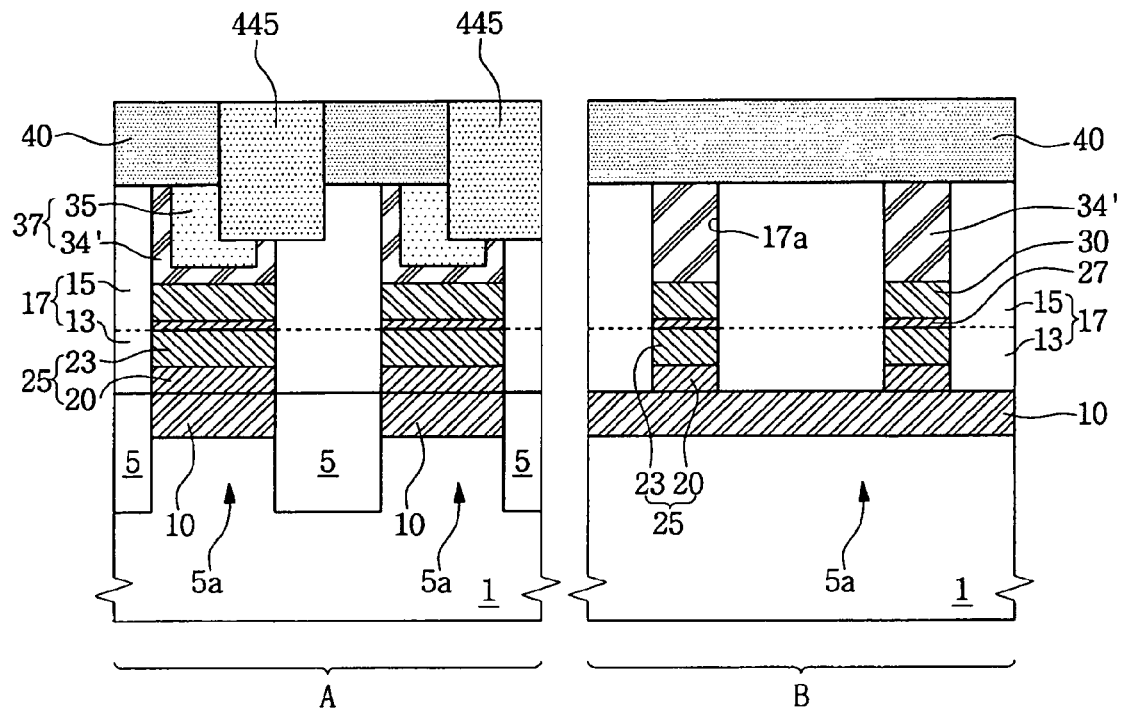
FIGS. 5A to 5C illustrate cross-sectional views of a method of fabricating a semiconductor device according to another example embodiment.
Figure 5B:
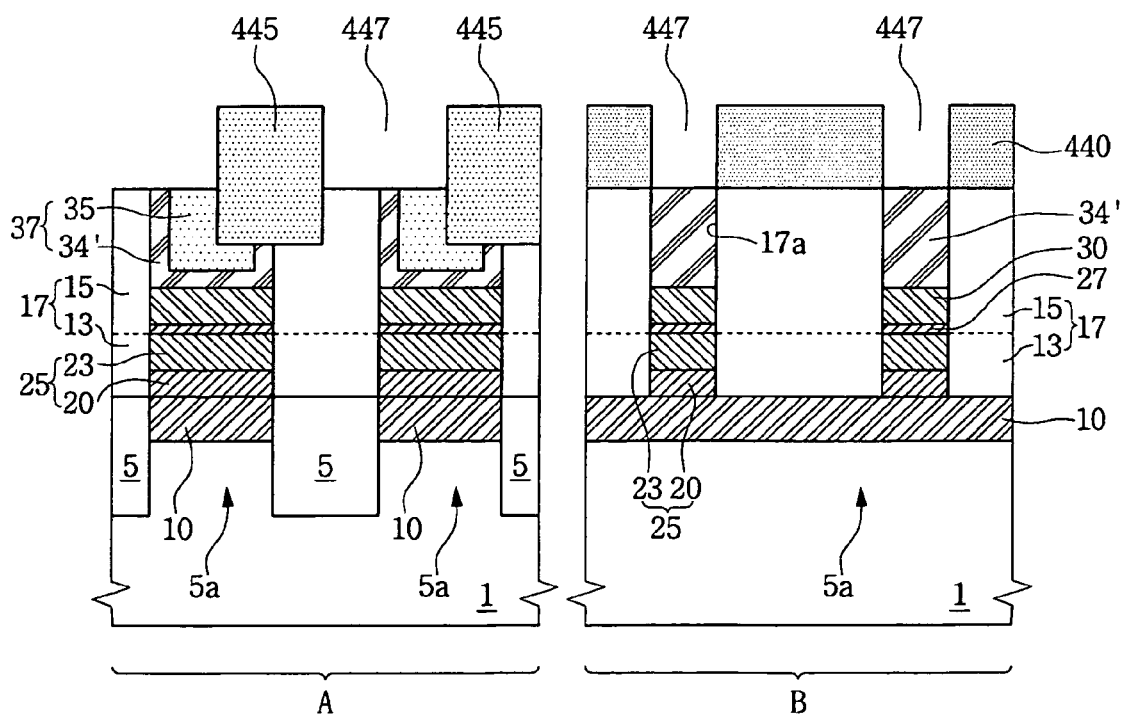
Figure 5C:
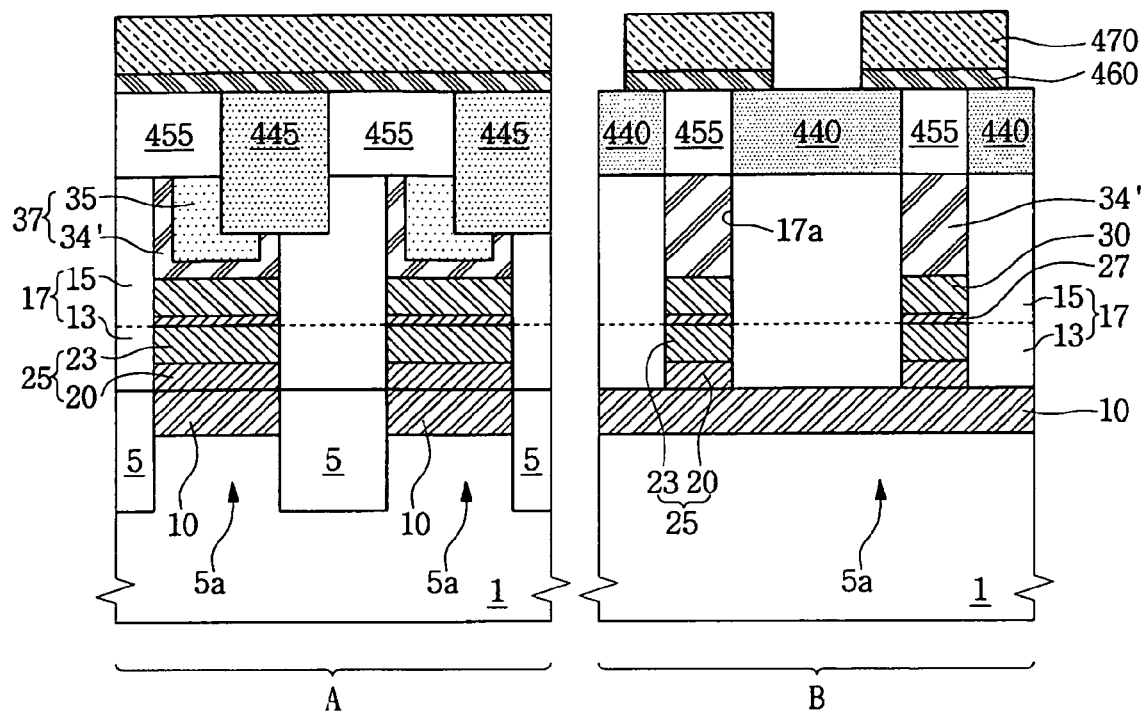
Figure 6:
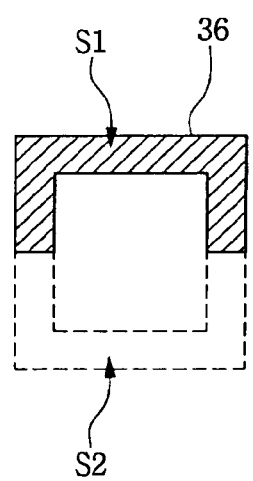
FIG. 6 illustrates a plan view of an electrode according to another example embodiment.

FIG. 1 illustrates a plan view of a semiconductor device according to example embodiments, FIGS. 2A to 2F illustrate cross-sectional views of a method of fabricating a semiconductor device according to an example embodiment, FIGS. 3A and 3B illustrate cross-sectional views of a method of fabricating a semiconductor device according to another example embodiment, FIGS. 4A and 4B illustrate cross-sectional views of a method of fabricating a semiconductor device according to still another example embodiment, FIGS. 5A to 5C illustrate cross-sectional views of a method of fabricating a semiconductor device according to another example embodiment, and FIG. 6 illustrates a plan view of an electrode according to another example embodiment. In FIGS. 2A to 2F, 3A, 3B, 4A, 4B, part A represents a cross-section of a region taken along line I-I' of FIG. 1, and part B represents a cross-section of region taken along line II-II' of FIG. 1.

First, a semiconductor device according to an example embodiment will be described with reference to FIGS. 1 and 2F. Referring to FIGS. 1 and 2F, an isolation region 5 defining a plurality of active regions 5a may be provided in a predetermined region of a semiconductor substrate 1 of a first conductivity type. The active regions 5a may be defined to be substantially in parallel to each other. First impurity regions 10 of a second conductivity type different from the first conductivity type may be provided in the active regions 5a, e.g., directly on the substrate 1. The first conductivity type may be a P type, and the second conductivity type may be an N type. Alternatively, the first and second conductivity types may be an N type and a P type, respectively. The first impurity regions 10 may be defined as a word line.

An interlayer insulating layer 17 having a plurality of holes 17a exposing predetermined regions of the first impurity regions 10 may be provided on the substrate 1, e.g., above the first impurity regions 10, as illustrated in FIG. 2F. The holes 17a of the interlayer insulating layer 17 may be disposed on the first impurity regions 10 to be adjacent to each other, and may be spaced apart from each other within a same first impurity region 10 by a first distance W1, as illustrated in FIG. 1. A hole 17a of the interlayer insulating layer 17 may be spaced apart from an adjacent hole 17a on an adjacent first impurity region 10 by a third distance L1, as further illustrated in FIG. 1. When viewed from a plan view, as illustrated in FIG. 1, each of the holes 17a may be in a shape of a circle. However, the shape of the holes 17a is not limited to a circle. For example, any suitable shape may be used, e.g., when viewed from a plan view each of the holes 17a may be in the shape of a rectangle.

As illustrated in FIG. 2F, semiconductor patterns 25 may partially fill the holes 17a. Second impurity regions 20 and third impurity regions 23, which may be sequentially stacked in the semiconductor patterns 25, may be provided. For example, the third impurity regions 23 may be of the first conductivity type and the second impurity regions 20 may be of the second conductivity type, e.g., a lower impurity concentration than the first impurity regions 10. Therefore, the second impurity regions 20 and the third impurity regions 23 may constitute a cell diode, and the first impurity regions 10 may function as a word line. In another example, the second impurity regions 20 and the third impurity regions 23 may have the same conductivity type, e.g., the first conductivity type, so the first impurity regions 10 and the second impurity regions 20 may constitute a cell diode.

As further illustrated in FIG. 2F, diode electrodes 27 may be provided on the third impurity regions 23. The diode electrodes 27 may include a metal silicide layer forming an ohmic contact together with the third impurity regions 23. For example, the metal silicide layer may include one or more of cobalt silicide layer, a nickel silicide layer, and a titanium silicide layer. Conductive buffer layers 30 may be provided on the diode electrodes 27. The conductive buffer layers 30 may include a metal material, e.g., tungsten. The conductive buffer layers 30 may prevent the diode electrodes 27 from being deteriorated by heat generated by lower electrodes 34' and phase change material patterns 55 during operation of the memory device.

As further illustrated in FIG. 2F, lower electrode structures 37 may be provided in the holes 17a. Each lower electrode structure 37 may include an internal insulating pattern 35 and a lower electrode 34' covering a sidewall and a bottom surface of the internal insulating pattern 35. For example, the lower electrode 34' may have a hollow cylindrical shape along sidewalls of the hole 17a as illustrated in FIGS. 1 and 2F, i.e., a structure having a bottom and thin annular walls surrounding the bottom and having a cross section of a "U" as illustrated in part A of FIG. 2F, so the internal insulating pattern 35 may be inserted to fill the hollow cylindrical shape of the lower electrode 34'. In other words, the lower electrode 34' may surround the bottom and at least part of the sidewalls of the internal insulating pattern 35. At least part of upper surfaces of the lower electrodes 34' may be disposed substantially at a same level as an upper surface of the interlayer insulting layer 17 and as part of the upper surfaces of the internal insulating pattern 35. It is noted that hereinafter "level" refers to a "height" with respect to the semiconductor substrate 1 and as measured along a normal to the semiconductor substrate 1. It is further noted that "upper surfaces" refer to surfaces facing away from the semiconductor substrate 1.

Also, each of the lower electrodes 34' may include an electrode bottom portion 33a having a shape of a plate, and an electrode body 33b projecting from at least a part of the electrode bottom portion 33a. The electrode body 33b may project from an edge portion of the electrode bottom portion 33a, e.g., the electrode body 33b may define sidewalls on the bottom portion 33a surrounding a volumetric space. The bottom regions of the lower electrodes 34', i.e., the electrode bottom portions 33a, may be self-aligned with the semiconductor patterns 25 in a vertical direction. That is, the semiconductor patterns 25, the diode electrodes 27, the buffer conductive layers 30 and the lower electrodes 34' may be self-aligned with each other in a vertical direction.

A distance between adjacent lower electrodes 34' may be substantially the same as a distance between adjacent holes 17a. That is, as illustrated in FIG. 1, lower electrodes 34' that are disposed within a same first impurity region 10 and are adjacent to each other may be spaced apart from each other by the first distance W1. In addition, as further illustrated in FIG. 1, lower electrodes 34' that are disposed on adjacent first impurity regions 10 may be spaced apart from each other by the third distance L1. In this respect, it is noted that a distance between adjacent lower electrodes 34' may be measured between facing outermost edges of adjacent electrodes.

In example embodiments, the electrode body 33b of each of the lower electrodes 34' may have upper surfaces disposed at different levels. For example, as illustrated in part A of FIG. 2F, a first electrode 34a selected from the lower electrodes 34' may include a first upper surface S1 and a second upper surface S2 disposed at a lower level than the first upper surface S1. Further, a second electrode 34b adjacent to the first electrode 34a among the lower electrodes 34' may include a third upper surface S3 and a fourth upper surface S4 disposed at a lower level than the third upper surface S3. The first and third upper surfaces S1 and S3 of respective first and second electrodes 34a and 34b may be disposed at a higher level than the second and fourth upper surfaces S2 and S4 of respective first and second electrodes 34a and 34b. As illustrated in FIG. 2F, the first and third upper surfaces S1 and S3 of the first and second electrodes 34a and 34b may be disposed substantially at a same level as the upper surface of the interlayer insulating layer 17.

As illustrated in FIG. 1, when the holes 17a are in the shape of a circle, each of the lower electrodes 34' may be a curved shape having a predetermined thickness, e.g., a hollow cylinder as discussed above. That is, when the bottom regions of the lower electrodes 34', i.e., the electrode bottom portions 33a, are in the shape of a circle, each of the electrode bodies 33b of the lower electrodes 34' may have a curved shape having a predetermined thickness, e.g., curved sidewalls conformal on inner surfaces of the holes 17a.

In another example embodiment, as illustrated in FIG. 6, each of the holes 17a may be in a shape of a rectangle. Therefore, lower electrodes 36 having electrode bottom portions 33a formed in a shape of a rectangle may be provided. That is, as illustrated in FIG. 6, the lower electrodes 36 may include non-curved body portions, i.e., straight sidewalls with linear line portions formed to a predetermined thickness may be provided. It is noted that the lower electrodes 36 having the shape of a rectangle as illustrated in FIG. 6 and the lower electrodes 34' having the shape of a circle as illustrated in FIG. 1 are substantially the same, with the exception of having a cross-section of an upper surface shaped as a rectangle, as opposed to being curved. Therefore, a detailed description of the lower electrodes 36 having the shape of a rectangle will be omitted.

An isolation pattern 45 may cover the second and fourth upper surfaces S2 and S4 of the first and second electrodes 34a and 34b, as illustrated in part A of FIG. 2F. The isolation pattern 45 may cover the second and fourth upper surfaces S2 and S4 of the first and second electrodes 34a and 34b, and may extend toward the internal insulating pattern 35 and toward the interlayer insulating layer 17. In addition, the isolation pattern 45 may be formed in the shape of a line. The isolation pattern 45 may be in the shape of a line having the same orientation as the impurity regions 10. In this case, as illustrated in FIG. 1, the isolation pattern 45 having the shape of a line may partially overlap the impurity regions 10. Meanwhile, the isolation pattern 45 may have an upper surface disposed substantially at the same level as that of the interlayer insulating layer 17.

As illustrated in FIG. 1, data storage patterns 55 including a first data storage pattern 55a covering a part of the first upper surface S1 of the first electrode 34a and a second data storage pattern 55b covering a part of the third upper surface S3 of the second electrode 34b may be provided. The first data storage pattern 55a of the data storage patterns 55 may be disposed to pass through a middle portion of the first upper surface S1 of the first electrode 34a, and the second data storage pattern 55b may be disposed to pass through a middle portion of the third upper surface S3 of the second electrode 34b. The first and second electrodes 34a and 34b may be spaced apart from each other by the first distance W1, i.e., as measured between outermost facing edges of adjacent lower electrodes 34', and the portion where the first data storage pattern 55a partially covers the first upper surface S1 of the first electrode 34a may be spaced apart from the portion where the second data storage pattern 55b partially covers the third upper surface S3 of the second electrode 34b by a second distance W2 greater than the first distance W1. For example, an interface region between the first data storage pattern 55a and the first electrode 34a is spaced apart from an interface region between the second data storage pattern 55b and the second electrode 34b by a second distance W2 greater than the first distance W1.

The data storage patterns 55 may include a phase change material pattern. The phase change material pattern may include a chalcogenide layer. The chalcogenide layer may include one or more of Te, Se, Ge, Sb, Bi, Pb, Sn, Ag, As, S, Si, P, O, and C. The data storage patterns 55 may be a line type having an orientation crossing the first impurity regions 10. Alternatively, the data storage patterns 55 may be an island-type. The first and second data storage patterns 55a, 55b of the data storage patterns 55 may have a resistance variation region, e.g., a phase change region, in the portion partially covering the first and third upper surfaces S1 and S3 of the first and second electrodes 34a and 34b.

A molding pattern 50 covering portions that are not covered by the data storage patterns 55 among the first and third upper surfaces S1 and S3 of the first and second electrodes 34a and 34b may be provided. Each of the molding patterns 50 may be a line shape having an orientation crossing the first impurity regions 10. For example, as illustrated in FIGS. 1 and 2F, in the first electrode 34a selected from the electrodes 34', the middle portion of the first upper surface S1 may be covered by the first data storage pattern 55a of the data storage patterns 55, and both end portions of the first upper surface S1 may be covered by the molding pattern 50.

In example embodiments, the second and fourth upper surfaces S2 and S4 of the first and second electrodes 34a and 34b may be covered by the isolation pattern 45, and the first and third upper surfaces S1 and S3 of the first and second electrodes 34a and 34b may be covered by the data storage patterns 55 and the molding pattern 50. Therefore, since an interface area between the data storage patterns 55 and the lower electrodes 34', at which Joule heat is generated, may be minimized, a current that is applied during the reset operation may be minimized.

Further, the first and second electrodes 34a and 34b may be spaced apart from each other by the first distance W1, and the portion where the first data storage pattern 55a partially covers the first upper surface S1 of the first electrode 34a may be spaced apart from an adjacent portion where the second data storage pattern 55b partially covers the third upper surface S3 of the second electrode 34b by the second distance W2 greater than the first distance W1. Therefore, in a phase change memory device according to example embodiments, a distance between portions of lower electrodes 34' contacting the phase change material patterns 55 may be greater than the distance between the lower electrodes 34'. In other words, even though two adjacent lower electrodes 34' may be positioned relatively close to each other, i.e., based on a distance between facing outer edges of the adjacent lower electrodes 34', exposed portions of upper surfaces of the adjacent lower electrodes 34', i.e., portions contacting the phase change material, may be increased.

Also, when the data storage patterns, i.e., the phase change material patterns 55, are a line type, one phase change material pattern may overlap a plurality of lower electrodes 34'. That is, the lower electrodes 34' sharing the phase change material pattern 55 may be spaced apart from each other by the third distance L1, and portions where the lower electrodes 34' and the phase change material patterns 55 contact each other may be spaced apart from each other by a fourth distance L2 greater than the third distance L1. Accordingly, since a distance between the portions where a phase change occurs may be maximized, i.e., the fourth distance L2, a thermal disturbance phenomenon between the phase change memory cells may be reduced. That is, heat generated in one cell when a phase change memory device operates may have a reduced effect on adjacent cells.

As further illustrated in part B of FIG. 2B, upper surfaces of the data storage patterns 55 may have recessed portions. Planarized buffer patterns 57 may be provided on the data storage patterns 55. The planarized buffer patterns 57 may include a conductive material. In addition, the planarized buffer patterns 57 may fill, at least the recessed regions of the data storage patterns 55. Conductive patterns 60 may be provided on the planarized buffer patterns 57. The conductive patterns 60 may be self-aligned with the data storage patterns

55. The planarized buffer patterns 57 and the conductive patterns 60 may constitute an upper electrode.

As further illustrated in FIG. 2F, an insulating spacer 63 may be provided on sidewalls of the data storage patterns 55, the planarized buffer patterns 57, and the conductive patterns 60. Electrode plugs 70 may be provided on the conductive patterns 60. When the data storage patterns 55 are a line shape, the conductive patterns 60 and the electrode plugs 70 may be in the shape of a line as well. An intermetal insulating layer 65 filling spaces between the data storage patterns 55, the conductive patterns 60, and the electrode plugs 70, which are sequentially stacked, may be provided. Conductive lines 75 may be provided on the electrode plugs 70. The conductive lines 75 may be in the shape of a line having an orientation crossing the impurity regions 10. Further, when the data storage patterns 55 are in the shape of a line, the conductive lines 75 may be in a shape of a line having the same orientation as the data storage patterns 55, and may overlap each other. In a memory device, the first impurity regions 10 may be defined as a word line, the conductive lines 75 may be defined as a bit line, and the electrode plugs 70 may be defined as a bit line plug.

In another example embodiment, as illustrated in FIG. 2F, the interlayer insulating layer 17 may include a lower interlayer insulating layer 13 and an upper interlayer insulating layer 15, which may be sequentially stacked. The first impurity regions 10 may be disposed in the semiconductor substrate 1, the cell diodes as a switching device may be disposed in the lower interlayer insulating layer 13, and the lower electrodes 34' may be provided in the upper interlayer insulating layer 15. Alternatively, MOS transistors as a switching device and word lines electrically connected to gate electrodes of the MOS transistors may be disposed in the lower interlayer insulating layer 13, and lower electrodes 34' electrically connected to one of source/drain regions of the MOS transistors may be disposed in the upper interlayer insulating layer 15.

In yet another example embodiment, as illustrated in FIG. 3B, the lower electrodes 34' and the isolation patterns 45 of FIG. 2F may be respectively changed into lower electrodes 34 and isolation patterns 250. More specifically, the memory device of FIG. 3B may be substantially the same as the memory device of FIG. 2F, with the exception of having upper surfaces of the lower electrodes 34 at a substantially same level, i.e., all upper surfaces of the lower electrodes 34 may be substantially level with the upper surface of the interlayer insulation layer 17 and the upper surface of the internal insulation layer 35, so the isolation patterns 250 may be disposed at a higher level than the interlayer insulating layer 17. The isolation patterns 45 of FIG. 2F and the isolation patterns 250 of FIG. 3B may cover a part of the upper surfaces of the lower electrodes 34' and 34 in common. Further, data storage patterns 255 of FIG. 3B may be a line type like the data storage patterns 55 illustrated in FIG. 2F. However, the shape of the data storage patterns 255 may not be limited to the line type.

For example, the data storage patterns 255 may be an island-type, in which entire sidewalls may be surrounded by the molding and isolation patterns 150 and 250, or the data storage patterns 255 may be an island-type, in which a part of sidewalls may be surrounded by the molding and isolation patterns 150 and 250. Each of the data storage patterns 255 may have a recessed region on the upper surface. Planarized buffer patterns 257 and conductive patterns 260 may be sequentially stacked on the data storage patterns 255. The data storage patterns 255 and the conductive patterns 260 may be self-aligned with each other. Meanwhile, when the conductive patterns 260 are in the shape of a line, different from the bit line of FIG. 2F, a bit line 270 according to the example embodiment of FIG. 3B may be disposed to be self-aligned with the conductive patterns 260.

In still another example embodiment, the data storage patterns 55 and molding patterns 50 of FIG. 2F may be changed into data storage patterns 355 and molding pattern 350, respectively, as illustrated in FIG. 4B. More specifically, the memory device of FIG. 4B may be substantially the same as the memory device of FIG. 2F, with the exception of having the molding patterns 350 surround entire sidewalls of the data storage patterns 355, e.g., the molding patterns 350 and the data storage patterns 355 may have substantially level lower surfaces and substantially level upper surfaces to have substantially same height. That is, the data storage patterns 355 illustrated in FIG. 4B may be laid out in a damascene structure having the shape of a line. Further, the data storage patterns 355 may be formed to have widths getting narrower in a downward direction, e.g., inverted trapezoid cross-section.

In yet another example embodiment, the isolation patterns 45, the molding patterns 50, and the data storage patterns 55 illustrated in FIG. 2F may be changed into the isolation patterns 445, molding patterns 440, and the data storage patterns 455, as illustrated in FIG. 5C. More specifically, as illustrated in FIG. 5C, the isolation patterns 445 of FIG. 5C may have upper surfaces disposed at a higher level than the isolation patterns 45 of FIG. 2F. Therefore, the isolation patterns 445 illustrated in FIG. 5C may have upper surfaces disposed at a higher level than the lower electrodes 34'. Also, as illustrated in FIG. 5C, a molding pattern 440 may be disposed between adjacent data storage patterns 445. Further, the molding patterns 440 may have upper surfaces disposed substantially at the same level as those of the isolation patterns 445. Moreover, the data storage patterns 455 illustrated in FIG. 5C may be disposed between the isolation patterns 445 and in a space between the molding patterns 440. That is, each of the data storage patterns 455 illustrated in FIG. 5C may be provided in an island-type, in which sidewalls are surrounded by the isolation patterns 445 and the changed molding patterns 440.

Next, a method of fabricating a semiconductor device according to an example embodiment will be described below with reference to FIGS. 1 and 2A-2F.

Referring to FIGS. 1 and 2A, the substrate 1 of a first conductive type may be prepared. The isolation region 5 defining the plurality of active regions 5a may be formed in a predetermined region of the substrate 1, e.g., a semiconductor substrate. The isolation region 5 may be formed using a shallow trench isolation technique. The active regions 5a may be defined to be substantially parallel to each other. Impurity ions of a second conductivity type different from the first conductivity type may be implanted into the active regions 5a to form the first impurity regions 10 of the second conductivity type. Consequently, the isolation region 5 may electrically isolate the first impurity regions 10 of the second conductivity type from each other. The first conductivity type may be a P-type, and the second conductivity type may be an N-type. Alternatively, the first and second conductivity types may be respectively N and P types. The first impurity regions 10 may be word lines of a memory device.

An interlayer insulating layer 17 may be formed on the entire surface of the semiconductor substrate 1 having the first impurity regions 10. The interlayer insulating layer 17 may be formed of, e.g., a silicon oxide layer. The interlayer insulating layer 17 may be patterned to form a plurality of holes 17a exposing predetermined regions of the first impurity regions 10. When viewed from a plan view, the holes 17a may be in the shape of a circle. However, the shape of the holes 17a may not be limited to the circle shape. For example, as illustrated in FIG. 6, the holes 17a may have rectangular cross-sections when viewed from a plan view.

The holes 17a that are disposed on an impurity region selected with a same first impurity region 10 and are adjacent to each other may be spaced apart from each other by the first distance W1. Also, holes 17a that are disposed on adjacent impurity regions 10 may be spaced apart from each other by a third distance L1. That is, holes 17a arranged in a direction parallel to the first impurity regions 10 may be spaced apart from each other by the first distance W1, and holes 17a arranged in a direction crossing the first impurity regions 10 may be spaced apart from each other by the third distance L1.

Semiconductor patterns 25 partially filling the holes 17a may be formed on the first impurity regions 10. For example, the semiconductor patterns 25 may be formed by a selective epitaxial growth technique adapting the first impurity regions 10 exposed through the holes 17a as a seed layer. Therefore, when the first impurity regions 10 have a single crystalline semiconductor structure, the semiconductor patterns 25 may be formed to have a single crystalline semiconductor structure as well. When the selective epitaxial growth technique is performed using silicon source gas, the semiconductor patterns 25 may be a silicon layer. Alternatively, the semiconductor patterns 25 may be formed using a solid phase epitaxial (SPE) technique.

A second impurity region 20 and a third impurity region 23, which may be sequentially stacked, may be formed in the semiconductor patterns 25. More specifically, impurity ions of the second conductivity type may be implanted into the semiconductor patterns 25 to form the second impurity region 20, and impurity ions of the first conductivity type may be implanted to form the third impurity region 23. Here, the second impurity region 20 may have a lower impurity concentration than the first impurity region 10. Therefore, the second impurity region 20 and the third impurity region 23 may constitute a cell diode, and the first impurity region 10 may function as a word line. Meanwhile, the second impurity region 20 and the third impurity region 23 may have the same conductivity type, e.g., the first conductivity type. In this case, the first impurity region 10 and the second impurity region 20 may constitute a cell diode.

Referring to FIGS. 1 and 2B, cell diode electrodes 27 may be formed on the semiconductor patterns 25. The cell diode electrodes 27 and the third impurity region 23 of the semiconductor patterns 25 may form an ohmic contact. For example, the cell diode electrodes 27 may be formed of a metal silicide layer, e.g., one or more of a cobalt silicide layer, a nickel silicide layer, a titanium silicide layer, etc. The metal silicide layer of the cell diode electrodes 27 may be formed in the holes 17a. Conductive buffer layers 30 containing a metal material, e.g., tungsten, may be formed on the cell diode electrodes 27. The conductive buffer layers 30 may be formed in the holes 17a.

Referring to FIGS. 1 and 2C, a lower electrode material layer may be formed along the surface of the semiconductor substrate 1 having the conductive buffer layers 30. More specifically, the lower electrode material layer may be formed to cover the conductive buffer layers 30 in the holes 17a, sidewalls of the holes 17a, and the upper surface of the interlayer insulating layer 17. Further, the lower electrode material layer may be formed to have a substantially uniform thickness. Then, an internal material layer filling the remaining part of the holes 17a may be formed on the lower electrode material layer.

Subsequently, the internal electrode material layer and the internal material layer may be planarized until the upper surface of the interlayer insulating layer 17 is exposed. As a result, lower electrode structures 37 including internal patterns 35 and lower electrodes 34 covering sidewalls and bottom surfaces of the internal patterns 35 may be formed in the holes 17a. The lower electrodes 34 may be formed of a metal layer including, e.g., one or more of Ti, TiSi, TiN, TiON, TiW, TiAlN, TiAlON, TiSiN, TiBN, W, WN, WON, WSiN, WBN, WCN, Si, Ta, TaSi, TaN, TaON, TaAlN, TaSiN, TaCN, Mo, MoN, MoSiN, MoAlN, NbN, ZrSiN, ZrAlN, Ru, CoSi, NiSi, a conductive carbon, Cu, etc. The internal patterns 35 may be formed of, e.g., a silicon nitride layer, a silicon oxide layer, etc.

In another example embodiment, the interlayer insulating layer 17 may be formed of at least two layers, e.g., a lower interlayer insulating layer 13 and an upper interlayer insulating layer 15, which may be sequentially stacked. In this case, processes of forming the lower interlayer insulating layer 13, and then forming cell diodes as a switching device in the lower interlayer insulating layer 13, and forming the upper interlayer insulating layer 15, and then forming up to the lower electrode structures 37 may be performed. Here, after the lower interlayer insulating layer 13 is formed, MOS transistors may be formed instead of the cell diodes.

Referring to FIGS. 1 and 2D, mask patterns 40 having openings 40a exposing at least a part of the lower electrode structures 37 may be formed on the semiconductor substrate having the lower electrode structures 37. Each of the mask patterns 40 may be formed in the shape of a line.

Then, the lower electrode structures 37 exposed through the openings 40a and the interlayer insulating layer 17 may be etched using the mask patterns 40 as etch masks to form trenches 40b. Meanwhile, the lower electrodes 34 exposed through the openings 40a may be selectively etched using the mask patterns 40 as etch masks. As a result, lower electrodes 34' having upper surfaces disposed at different levels may be formed. Each of the lower electrodes 34' may include a bottom portion 33a having the shape of a plate and an electrode body 33b projecting from at least the electrode bottom portion 33a. Here, the electrode body 33b may project from an edge portion of the electrode bottom portion 33a. When viewed from a plan view, each of the lower electrodes 34' may be in the shape of a circle or a rectangle.

In the example embodiment, a first electrode 34a selected from the lower electrodes 34' may include the first upper surface S1 and the second upper surface S2 disposed at a lower level than the first upper surface S1. Further, the second electrode 34b adjacent to the first electrode 34a among the lower electrodes 34' may include the third upper surface S3 and the fourth upper surface S4 disposed at a lower level than the third upper surface S3. Here, while only the first and second electrodes 34a and 34b formed on an impurity region selected from the first impurity regions 10 are described, the same principle may be applied to electrodes formed on impurity regions spaced apart from each other.

The first and third upper surfaces S1 and S3 of the first and second electrodes 34a and 34b may be disposed at a higher level than the second and fourth upper surfaces S2 and S4 of the first and second electrodes 34a and 34b. Moreover, the first and third upper surfaces S1 and S3 of the first and second electrodes 34a and 34b may be disposed substantially at the same level as the upper surface of the interlayer insulating layer 17.

Referring to FIGS. 1 and 2E, the mask patterns 40 may be removed. Then, isolation pattern 45 filling the trenches 40b may be formed. The isolation pattern 45 may be formed of an insulating material, e.g., a silicon oxide layer or a silicon nitride layer. Accordingly, the second and fourth upper surfaces S2 and S4 of the first and second electrodes 34a and 34b may be covered by the isolation pattern 45, and the first and third upper surfaces S1 and S3 of the first and second electrodes 34a and 34b may be exposed.

Molding patterns 50 having openings 50a exposing a part of the exposed upper surfaces of the exposed lower electrodes 34' may be formed. That is, a part of the first and third upper surfaces S1 and S3 of the first and second electrodes 34a and 34b may be exposed through the openings 50a of the molding patterns 50.

In the example embodiments, each of the molding patterns 50 may be formed in the shape of a line having an orientation crossing the first impurity regions 10. Moreover, the openings 50a of the molding patterns 50 may cross and expose the middle portions of the first and third upper surfaces S1 and S3 of the first and second electrodes 34a and 34b. Therefore, exposed portions of the first and third upper surfaces S1 and S3 of the first and second electrodes 34a and 34b may be spaced apart from each other by the second distance W2 greater than the first distance W1. In addition, parts of the exposed upper surfaces of the electrodes 34' arranged in a direction crossing the impurity regions 10, e.g., along a vertical direction of the impurity regions 10, may be spaced apart from each other by a fourth distance L2 greater than the third distance L1.

In the meantime, the molding patterns 50 may have inclined sidewalls so that the openings 50a may get narrower in the downward direction.

Referring to FIGS. 1 and 2F, data storage patterns 55 covering the portions exposed through the openings 50a of the molding patterns 50 among the upper surfaces of the lower electrodes 34', planarized buffer patterns 57 on the data storage patterns 55, and conductive patterns 60 on the planarized buffer patterns 57 may be formed. The data storage patterns 55 may be formed in a line type having an orientation crossing the impurity regions 10. That is, one data storage pattern selected from the data storage patterns 55 may cover the plurality of lower electrodes 34'. The data storage patterns 55 may be formed of phase change material patterns. The phase change material patterns may include a chalcogenide layer, e.g., a GST layer. More specifically, a phase change material layer may be formed on the semiconductor substrate 1 having the molding patterns 50, and the phase change material layer may be patterned using photolithography, so that phase change material patterns having an orientation crossing the first impurity regions 10, i.e., the data storage patterns 55, may be formed. The planarized buffer patterns 57 and the conductive patterns 60 may be defined as an upper electrode.

Meanwhile, each of the data storage patterns 55 may have a recessed region on the upper surface. Further, the planarized buffer patterns 57 may be formed to fill at least the recessed regions. The recessed regions of the data storage patterns 55 may be disposed on the lower electrode 34' exposed through the openings 50a of the molding patterns 50.

Forming the data storage patterns 55, the planarized buffer patterns 57, and the conductive patterns 60 may include forming a data storage layer, i.e., a phase change material layer, on the substrate having the molding patterns 50, forming a buffer layer on the data storage layer, planarizing the buffer layer to form a planarized buffer layer, forming a conductive material layer on the planarized buffer layer, forming mask patterns on the conductive material layer, and etching the conductive material layer, the planarized buffer layer, and the data storage layer using the mask patterns as etch masks. Therefore, the data storage patterns 55 and the conductive patterns 60 may be self-aligned with each other.

When the mask patterns are formed of a photoresist material, the mask patterns may be removed. Meanwhile, when the mask patterns are formed of a silicon nitride layer or a silicon oxide layer, the mask patterns may remain.

The buffer layer may be a material layer that does not react with the phase change material layer. For example, the buffer layer may be formed to include a metal layer, e.g., a titanium layer, or a metal nitride layer, e.g., a titanium nitride layer.

An insulating space 63 may be formed on sidewalls of the data storage patterns 55, the planarized buffer patterns 57, the conductive patterns 60, and the mask patterns (not shown), which may be sequentially stacked. Then, an intermetal insulating layer 65 may be formed on the semiconductor substrate 1 having the data storage patterns 55, the planarized buffer patterns 57, and the conductive patterns 60. The intermetal insulating layer 65 may be patterned to form openings exposing the conductive patterns 60, and to form conductive plugs filling the openings, i.e., bit line plugs 70. The planarized buffer patterns 57 on the data storage patterns 55 and the conductive patterns 60 having a uniform thickness may enable the conductive plugs 70 to have stable contact on the data storage patterns 55 having recessed region on the upper surfaces. That is, the planarized buffer patterns 57, the conductive patterns 60, and the conductive plugs 70, which may be sequentially formed on the data storage patterns 55 having the recessed regions on the upper surfaces, may form stable contact.

Conductive lines covering the bit line plugs 70 and having an orientation crossing the first impurity regions 10 i.e., bit lines 75, may be formed on the intermetal insulating layer 65. When the data storage patterns 55 are formed in a line type, the conductive patterns 60 and the bit line plugs 70 may be formed in a line type. It is noted that example embodiments are not limited to the above description of FIGS. 2A to 2F, and other configurations are included within the scope of the present invention. Example embodiments embodied in different forms may be described below.

First, a method of fabricating a semiconductor device embodied in different forms may be described below with reference to FIGS. 1, 3A and 3B.

Referring to FIGS. 1 and 3A, a semiconductor substrate 1 formed using a method of fabricating a semiconductor device described with reference to FIGS. 2A to 2C is prepared, i.e., up to the lower electrode structures 37. Each of the lower electrode structures 37 according to the example embodiment may include an internal pattern 35 and a lower electrode 34 surrounding a sidewall and a bottom surface of the internal pattern 35, and the lower electrode 34 may include an electrode bottom portion and an electrode body projecting from a part of the electrode bottom portion. Here, the electrode body may project from an edge portion of the electrode bottom portion, and may include the upper surface disposed substantially at the same level as that of the interlayer insulating layer 17.

As illustrated in FIG. 3A, isolation patterns 250 having openings 250a partially exposing upper surfaces of the lower electrodes 34 may be formed on the semiconductor substrate 1 having the lower electrode structures 37. Molding patterns 150 having openings 150a partially exposing the upper surfaces of the lower electrodes 34 may be formed on the semiconductor substrate 1 having the isolation patterns 250.

In the example embodiment, the sequence of forming the isolation patterns 250 and the molding patterns 150 may not be limited hereto. For example, after the molding patterns 150 are formed, the isolation patterns 250 may be formed, or after the isolation patterns 250 are formed, the molding patterns 150 may be formed.

The openings 150a and 250a of the molding patterns 150 and the isolation patterns 250 may be in the shape of a line having an orientation crossing each other. Each of the openings 250a of the isolation patterns 250 may expose about a half of the upper surface of a selected lower electrode 34. Further, each of the openings 150a of the molding patterns 150 may cross the middle portion of the exposed portion of the upper surface of the selected lower electrode 34. Therefore, about a half of the upper surface of a lower electrode 34 selected from the lower electrodes 34 may be covered by the isolation patterns 250, and the upper surface of the selected lower electrode 34, which is not covered by the isolation patterns 250, may be partially covered by the molding patterns 150. Only a part of the upper surface of the selected lower electrode 34 may be exposed on the region that is not covered by the molding patterns 150 and the isolation patterns 250, i.e., the region, in which the openings 150a and 250a of the molding patterns 150 and isolation patterns 250 overlap. A part of the upper surfaces of the exposed lower electrodes 34 is substantially the same as partially exposed upper surfaces of the lower electrodes 34' described with reference to FIG. 2E.

Meanwhile, the molding patterns 150 may have inclined sidewalls so that widths of the openings 150a are getting narrower in the downward direction. Similarly, the isolation patterns 250 may have inclined sidewalls so that widths of the openings 250a are getting narrower in the downward direction.

Referring to FIGS. 1 and 3B, a data storage layer and a buffer layer may be formed on the semiconductor substrate having the molding patterns 150 and the isolation patterns 250. The data storage layer may have recessed regions on the upper surface. The recessed regions may be disposed on the lower electrodes 34 exposed through the openings 150a and 250a of the molding patterns 150 and the isolation patterns 250. The buffer layer may be planarized to form a planarized buffer layer. Afterwards, a conductive material layer may be formed on the planarized buffer layer, and mask patterns 270 may be formed on the conductive material layer. The conductive material layer, the planarized buffer layer, and the data storage layer may be etched using the mask patterns 270 as etch masks to form the data storage patterns 255, the planarized buffer layer 257 and the conductive patterns 260, which are sequentially stacked. The planarized buffer layer 257 and the conductive patterns 260 may constitute an upper electrode. Then, bit lines may be formed using substantially the same method described with reference to FIG. 2F.

Meanwhile, the mask patterns 270 may be formed to include a conductive material. Therefore, different from FIG. 2F, the mask patterns 270 may be used as bit lines. Consequently, the data storage patterns 255, the conductive patterns 260 and the mask patterns 270 may be self-aligned with each other.

According to another example embodiment, a method of fabricating a semiconductor device will be described below with reference to FIGS. 1, 4A and 4B.

Referring to FIGS. 1 and 4A, the semiconductor substrate 1 formed by the method of fabricating the semiconductor device described with reference to FIGS. 2A to 2E may be prepared, i.e., up to the isolation patterns 45. Each of the lower electrodes 34 according to the example embodiment may include the electrode bottom portion 33a, the electrode body 33b projecting from at least a part of the electrode bottom portion 33a, and the electrode body 33b may include upper surfaces S1 and S2 disposed at different levels as described in FIG. 2E. The isolation patterns 45 may have upper surfaces disposed substantially at the same level as the upper surface of the interlayer insulating layer 17.

The molding patterns 350 with the openings 350a partially exposing the upper surfaces of the lower electrodes 34. Here, the upper surface disposed at a higher level among the upper surfaces of the lower electrodes 34 may correspond to the first and third upper surfaces S1 and S3 of the first to fourth upper surfaces S1, S2, S3 and S4 of the first and second electrodes 34a and 34b.

The molding patterns 350 may have inclined sidewalls so that widths of the openings 250 may be getting narrower in the downward direction. Alternatively, the openings 350a of the molding patterns 350 may have vertical sidewalls. Each of the molding patterns 350 may be in the shape of a line. Alternatively, the openings 350a of the molding patterns 350 may be in an island type.

Referring to FIGS. 1 and 4B, a data storage layer, e.g., a phase change material layer, may be formed on the semiconductor substrate having the molding patterns 350. Afterwards, the phase change material layer may be planarized using a planarization technique until upper surfaces of the molding patterns 350 are exposed. As a result, phase change material patterns 355 filling the openings 350a of the molding patterns 350 and having the shape of a line may be formed. Here, the phase change material patterns 355 may be in contact with a part of the first upper surfaces S1 of the lower electrodes 34. Then, upper electrodes 360 and conductive lines 370, which are sequentially stacked on the phase change material patterns 355, may be formed.

Next, a method of fabricating a semiconductor device according to still another example embodiment will be described below with reference to FIGS. 1, 5A and 5B.

Referring to FIGS. 1 and 5A, a semiconductor device formed by the method of fabricating a semiconductor device described with reference to FIGS. 2A to 2D may be prepared. That is, a semiconductor substrate 1, i.e., up to the trenches 40b, described with reference to FIG. 2D may be prepared. Then, the mask patterns 40 may be formed of, e.g., a silicon oxide layer or a silicon nitride layer. Also, the mask patterns 40 may be formed to include, e.g., a polysilicon layer.

An isolated insulating material layer may be formed on the semiconductor substrate, in which the trenches 40b are formed. Then, the isolated insulating material layer may be planarized until upper surfaces of the mask patterns 40 are exposed, so that isolation patterns 445 may be formed. The isolation patterns 445 may be formed to have upper surfaces disposed at a higher level than the upper surface of the interlayer insulating layer 17. The isolation patterns 445 may be formed of an insulating material layer having an etch selectivity with respect to the mask patterns 40. For example, when the mask patterns 40 are formed of a silicon nitride layer, the isolation patterns 445 may be formed of a silicon oxide layer. Also, the mask patterns 40 may be formed of a material layer having an etch selectivity with respect to the internal insulating patterns 35 and the interlayer insulating layer 17. For example, when the internal insulating patterns 35 and the interlayer insulating layer 17 are formed of a silicon oxide layer, the mask patterns 40 may be formed of a silicon nitride layer.

Referring to FIGS. 1 and 5B, a photoresist pattern may be formed on the semiconductor substrate having the isolation patterns 445 and the mask patterns (40 of FIG. 5A), and the mask patterns (40 of FIG. 5A) may be selectively etched, so that openings 447 exposing a part of the first and third upper surfaces S1 and S3 of the lower electrodes 34' may be formed. Here, the mask patterns may be defined as molding patterns 440. In an example embodiment, the molding patterns 440 may be disposed in a predetermined region between the isolation patterns 445 and may be spaced apart from each other. Therefore, a part of the first and third upper surfaces S1 and S3 of the lower electrodes 34 may be exposed through a space disposed between the isolation patterns 445 and between the molding patterns 440.

A phase change material layer may be formed on the semiconductor substrate 1 having the isolation patterns 445 and the molding patterns 440. Then, the phase change material layer may be planarized until upper surfaces of the isolation patterns 445 and the molding patterns 440 are exposed, so that phase change material patterns 455 filling the openings (447 of FIG. 5B) may be formed. In an example embodiment, the phase change material patterns 455 may be formed in an island type. Then, upper electrodes 460 and conductive lines 470, which are sequentially stacked, may be formed on the semiconductor substrate having the phase change material patterns 455. The conductive line 470 may have an orientation crossing the word lines 10, and may be defined as a bit line of a memory device.

According to example embodiments, a cell structure of a phase change memory device capable of minimizing an interface area between the phase change material layer and the lower electrode may be provided. Therefore, a reset current of the phase change memory device may be minimized. Also, a distance between adjacent phase change material layers may be maximized, while a distance between corresponding adjacent lower electrodes may be minimized, so that a thermal disturbance phenomenon between the phase change memory cells may be reduced. That is, heat that is generated in a cell during operation of the phase change memory device may have a minimum effect on adjacent cells.

Example embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
an insulating layer on a substrate;
a first electrode in the insulating layer, the first electrode having a first upper surface and a second upper surface;
a second electrode in the insulating layer spaced apart from the first electrode by a first distance, the second electrode having a third upper surface and a fourth upper surface, the third upper surface being disposed at a substantially same level as the first upper surface, and the fourth upper surface being disposed at a substantially same level as the second upper surface;
a first phase change material pattern covering a part of the first upper surface of the first electrode; and
a second phase change material pattern covering a part of the third upper surface of the second electrode, wherein an interface region between the second phase change pattern and the second electrode is spaced apart from an interface region between the first phase change pattern and the first electrode by a second distance greater than the first distance.

2. The semiconductor device as claimed in claim 1, further comprising:
an isolation pattern on the second and fourth upper surfaces of the first and second electrodes; and
a molding pattern on the first and third upper surfaces of the first and second electrodes, the molding pattern covering a portion other than the part of the first and third upper surfaces of the first and second electrodes covered by the first and second phase change material patterns.

3. The semiconductor device as claimed in claim 2, wherein the first and third upper surfaces of the first and second electrodes are disposed at a higher level than the second and fourth upper surfaces of the first and second electrodes.

4. The semiconductor device as claimed in claim 3, wherein the upper surface of the isolation pattern is at a substantially same level as that of the insulating layer and the upper first and third surfaces.

5. The semiconductor device as claimed in claim 3, wherein sidewalls of the first and second phase change material patterns are surrounded by the molding and the isolation patterns.

6. The semiconductor device as claimed in claim 3, wherein an upper surface of the molding pattern is disposed at the same level as that of the isolation pattern.

7. The semiconductor device as claimed in claim 3, wherein a height of the first and second phase change material patterns is substantially the same as a height of the molding pattern.

8. The semiconductor device as claimed in claim 2, wherein the first and second upper surfaces are disposed at the same level as the third and fourth upper surfaces.

9. The semiconductor device as claimed in claim 1, wherein the first and second phase change material patterns cross middle portions of the first and third upper surfaces of the first and second electrodes.

10. The semiconductor device as claimed in claim 1, wherein each of the first and third upper surfaces of the first and second electrodes has a line shape or a curved shape when viewed from a plan view.

11. The semiconductor device as claimed in claim 1, wherein each of the first and second electrodes includes a bottom portion having a shape of a plate, and a body projecting from an edge portion of the bottom portion to define sidewalls on the plate surrounding a volumetric space.

12. The semiconductor device as claimed in claim 1, further comprising first and second cell diodes on the substrate, the first cell diode being disposed at a lower level than the first electrode and aligned with a bottom portion of the first electrode, and the second cell diode being at a lower level than the second electrode and aligned with a bottom portion of the second electrode.

13. The semiconductor device as claimed in claim 1, further comprising:
a planarized buffer pattern on each of the first and second phase change material patterns; and
a conductive pattern on the planarized buffer pattern, each of the first and second phase change material patterns having a recessed region on an upper surface thereof.

14. The semiconductor device as claimed in claim 13, wherein each of the first and second phase change material patterns is self-aligned with the conductive pattern.

15. A semiconductor device, comprising:
a lower electrode on a substrate, the lower electrode having first and second upper surfaces disposed at different heights as determined with respect to the substrate;
a phase change material pattern covering a part of the first upper surface of the lower electrode; and
an insulating material covering the second upper surface of the lower electrode and a portion other than the part of the first upper surfaces of the lower electrode covered by the phase change material pattern.

16. The semiconductor device as claimed in claim 15, wherein the first upper surface is disposed at a higher level than the second upper surface.

17. The semiconductor device as claimed in claim 15, further comprising:

a planarized buffer pattern on the phase change material pattern; and a conductive pattern on the planarized buffer pattern, the conductive pattern being self-aligned with the phase change material pattern, and the phase change material pattern having a recessed region on the upper surface thereof.

* * * * *